United States Patent
Lee et al.

(10) Patent No.: US 8,335,084 B2
(45) Date of Patent: Dec. 18, 2012

(54) EMBEDDED ACTIVES AND DISCRETE PASSIVES IN A CAVITY WITHIN BUILD-UP LAYERS

(75) Inventors: Baik-Woo Lee, Atlanta, GA (US); Chong Yoon, Roswell, GA (US); Verkatesh Sundaram, Atlanta, GA (US); Rao Tummala, Stone Mountain, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 191 days.

(21) Appl. No.: 11/494,259

(22) Filed: Jul. 27, 2006

(65) Prior Publication Data

US 2007/0025092 A1   Feb. 1, 2007

Related U.S. Application Data

(60) Provisional application No. 60/704,505, filed on Aug. 1, 2005.

(51) Int. Cl.
*H05K 7/20* (2006.01)
(52) U.S. Cl. .................. 361/720; 361/761; 361/760
(58) Field of Classification Search .......... 257/433; 174/250, 260–262; 361/736, 748, 720, 760–761; 29/840
See application file for complete search history.

(56) References Cited

U.S. PATENT DOCUMENTS

| | | | |
|---|---|---|---|
| 3,903,590 A | | 9/1975 | Yokogawa |
| 5,353,498 A | | 10/1994 | Fillion et al. |
| 5,565,706 A | * | 10/1996 | Miura et al. ............... 257/723 |
| 5,866,952 A | | 2/1999 | Wojnarowski et al. |
| 6,396,148 B1 | | 5/2002 | Eichelberger et al. |
| 6,506,632 B1 | * | 1/2003 | Cheng et al. ............... 438/126 |
| 6,784,020 B2 | * | 8/2004 | Lee et al. ................... 438/106 |
| 6,800,946 B2 | * | 10/2004 | Chason et al. ............... 257/778 |
| 6,806,428 B1 | * | 10/2004 | Kimura et al. ............... 174/260 |
| 6,809,268 B2 | * | 10/2004 | Hayashi et al. ............... 174/260 |
| 6,836,025 B2 | * | 12/2004 | Fujisawa et al. ............. 257/782 |
| 6,974,724 B2 | | 12/2005 | Hyvonen et al. |
| 7,042,106 B2 | * | 5/2006 | Lu et al. .................... 257/789 |

(Continued)

OTHER PUBLICATIONS

Ravi Mahajan et al., "Emerging Directions for Packaging Technologies", Intel Technology Journal, vol. 6, No. 2 (2002) pp. 62-75.

(Continued)

*Primary Examiner* — Hung S Bui
(74) *Attorney, Agent, or Firm* — Ryan A. Schneider, Esq.; Troutman Sanders LLP

(57) ABSTRACT

Disclosed are any electronic system or module which includes embedded actives and discrete passives, and methods for use in fabricating packages containing embedded active devices and/or discrete passive devices. Exemplary apparatus comprises a plurality of build-up layers defining circuit interconnections and that comprise one or more thin film type of embedded passive devices, at least a cavity formed in the build-up layers, and at least an active device and/or at least a discrete passive device disposed in the cavity and electrically connected to the circuit interconnections of the build-up layers. A stiffener may be coupled to an exposed (back) surface of the active device and to an adjacent surface of the build-up layers. The build-up layers may be mounted to a core, and the core may be attached to a printed circuit board. Alternatively, a bottom surface of the build-up layers may be mounted to a printed circuit board without core. The packages have a chip reworkability, an easier thermal management, a very thin profile and enhanced electrical performance comparable to packages produced using chip-first or chip-middle approaches.

9 Claims, 5 Drawing Sheets

U.S. PATENT DOCUMENTS

| | | | | |
|---|---|---|---|---|
| 7,400,035 | B2* | 7/2008 | Abe et al. | 257/700 |
| 7,569,925 | B2* | 8/2009 | Nishizawa et al. | 257/700 |
| 7,598,610 | B2* | 10/2009 | Hsu et al. | 257/703 |
| 7,705,446 | B2* | 4/2010 | Chia et al. | 257/703 |
| 8,021,930 | B2* | 9/2011 | Pagaila | 438/124 |
| 8,130,507 | B2* | 3/2012 | Origuchi et al. | 361/760 |
| 2002/0037138 | A1* | 3/2002 | Kaneko et al. | 385/49 |
| 2005/0230797 | A1* | 10/2005 | Ho et al. | 257/678 |
| 2006/0087037 | A1* | 4/2006 | Hsu | 257/738 |
| 2008/0185704 | A1* | 8/2008 | Hsu et al. | 257/690 |

OTHER PUBLICATIONS

H. Reichl, et al., "The Third Dimension in Microelectronics Packaging", 14th European Microelectronics and Packaging Conference & Exhibition Friedrichshafen, Germany, Jun. 23-.

Helsinki Tarja Rapala-Virtanen, et al., "Embedding Passive and Active Components in PCB-Solution for Miniaturization", The ECWC 10 Conference at IPC Printed Circuits Expo®, SMEMA Council APEX® and Designers Summit 05 (2005) pp. S16-1-1-S16-1-7.

Liang, et al., "Integrated Packaging of a 1 kW Switching Module Using a Novel Planar Integration Technology", IEEE Transactions on Power Electronics, vol. 19, No. 1 (2004).

Yu-Hua Chen, et al., "Chip-in-Substrate Package, CiSP, Technology", 2004 Electronics Packaging Technology Conference (2004) pp. 595-599.

Masahiro Sunohara, et al., "Development of Interconnect Technologies for Embedded Organic Packages", 2003 Electronic Components and Technology Conference, New Orleans, May 27-30, 2003 pp. 1484-1489.

Yoshiko Hare, "Matsushita embeds SoCs, components in substrate", EE Times, Sep. 2002.

* cited by examiner

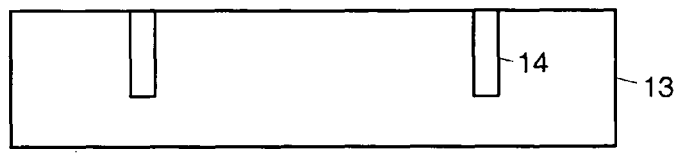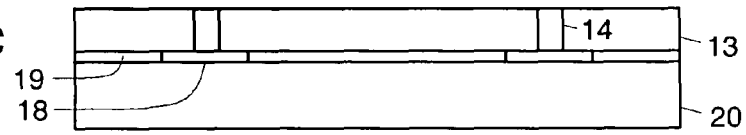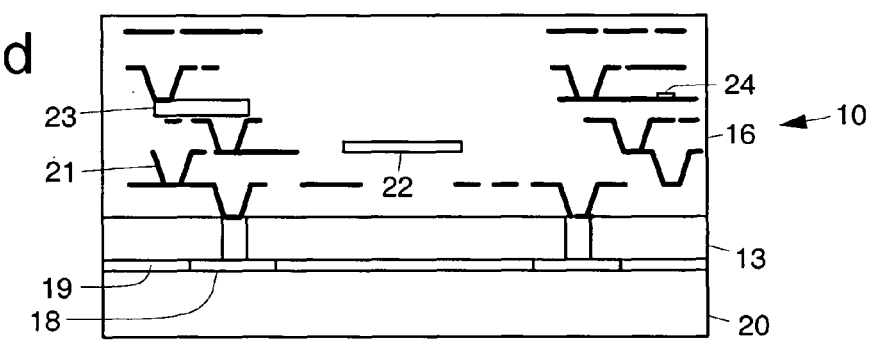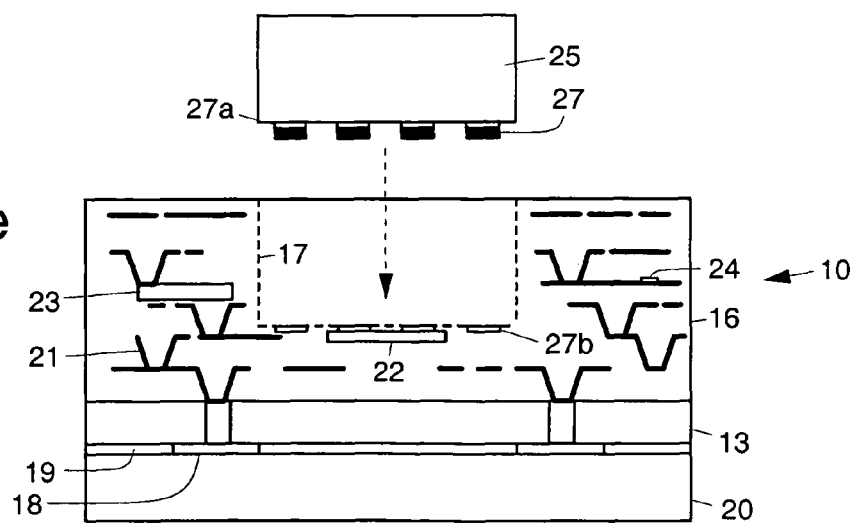

EMBEDDED ACTIVES AND DISCRETE PASSIVES IN A CAVITY WITHIN BUILD-UP LAYERS

This application claims the benefit of U.S. Provisional Application No. 60/704,505, filed Aug. 1, 2005.

BACKGROUND

The present invention relates generally to any electronic system or module which includes embedded actives and discrete passives, and methods for use in fabricating a system or module with embedded active and discrete passive devices.

Embedded actives (active devices) have been realized as a promising package technology to achieve an ultra-miniaturized form factor as well as better electrical performance by burying active chips directly into a core or build-up layers. In addition to active ICs, discrete passives such as capacitors, resistors, inductors, IPDs (integrated passive devices) and other similar discretes can be also embedded. Embedded active technology is mainly used for portable applications that require extremely small form-factors and lower power. Cell phones and laptop PCs, for example, having a 2004 world market size of 150 billion and 60 billion U.S. dollars, respectively, are the most representative items. Since the use of portable devices has expanded rapidly in recent years and its trend should continue, it is expected that the demand for embedded active becomes tremendous.

Active ICs have been embedded into a core or build-up layers in many different ways, with the following being a broad classification of the approaches involved: chip-first, chip-middle, and chip-last.

In the chip-first approach, embedding starts typically with actives and build up of wiring takes place on top of the actives. Demonstratio7n of this chip-first embedded active dates back to 1975 by Yokogawa (see U.S. Pat. No. 3,903,590). Multiple semiconductor chips are mounted face up on Al metal substrate and forced towards the substrate with a press-jig, which leads to partial embedding of the chips into the substrate. More recent types of chip-first embedded actives have been developed by GE (see U.S. Pat. No. 5,353,498), Intel (see Ravi Mahajan et al., "Emerging Directions For Packaging Technologies", Intel Technology Journal, Vol. 6, No. 2 (2002) pp. 62-75), Fraunhofer (see H. Reichl, et al., "The Third Dimension In Microelectronics Packaging", 14th European Microelectronics and Packaging Conference & Exhibition Friedrichshafen, Germany, Jun. 23-25 (2003) pp. 1-6) and others since the early 1990s.

GE molds plastic around the chips and then builds up a multilayer interconnection over the top of the chips using polyimide films with vias formed using laser (see U.S. Pat. No. 5,353,498). Lockheed Martin also embedded chips and capacitors into a plastic-molded substrate similar to GE, except that they used some compliant materials around the chips to reduce thermal stress due to CTE (Coefficient of Thermal Expansion) mismatch between the chip and the molding materials (see U.S. Pat. No. 5,866,952).

Intel, Helsinki University and others are developing an embedded active technology that utilizes organic cores such as BT (Bismaleimide Triazine) laminate and FR4 instead of the plastic molded substrate of GE and Lockheed Martin. Intel followed up with a cavity-based approach with a microprocessor chip placed in the cavity in the BT core (see the Ravi Mahajan et al. paper). Helsinki university in collaboration with Imbera Electronics also uses a similar cavity-based approach to embed chips into FR4 core except that the build-up layers are processed on both surfaces of the core layer (see Helsinki Tarja Rapala-Virtanen, et al., "Embedding Passive and Active Components in PCB-Solution for Miniaturization", The ECWC 10 Conference at IPC Printed Circuits Expo®, SMEMA Council APEX® and Designers Summit 05 (2005) pp. S16-1-1~7). Another cavity-based approach developed by Virginia Polytech involves embedding their power MOSFET chips into the cavities of ceramic substrates (see Zhenxian Liang, et al., "Integrated Packaging of a 1 kW Switching Module Using a Novel Planar Integration Technology", IEEE Transactions on Power Electronics, Vol. 19, No. 1 (2004) pp. 242-250).

Fraunhofer IZM and TU Berlin together have introduced the so-called Chip in Polymer (CIP) technology concept (see the H. Reichl, et al. paper). Chips are mounted on the substrate by die bonding followed by embedding inside a film of dielectric layer. Additionally, resistors can be also integrated into the package by deposition of very thin resistive metal films.

In SHIFT (Smart High-Integration Flex Technologies Flexible Laminate) project funded by EC (European Commission), eight research partners including IMEC, Technical University of Berlin, Fraunhofer IZM and others are developing a flexible embedded active structure without core (see http://www.vdivde-it.de/portale/shift/). Chips are placed face up on spin-coated flexible polyimide films and embedded into build-up layers by polyimide coating followed by metallization.

Casio Computer, in collaboration with CMK board manufacturer, is also developing chip-first embedded active technology by embedding wafer level packages (WLP) into boards (see http://world.casio.com/corporate/news/2006/ewlp.html).

Others disclosures relating to the chip-first approach include U.S. Pat. No. 6,396,148 and Yu-Hua Chen, et al., "Chip-in-Substrate Package, CiSP, Technology", 2004 Electronics Packaging Technology Conference (2004) pp. 595-599.

In the chip-middle approach, embedded chips end up in the middle of build-up substrate, Shinko's approach being one of the representative examples of this approach (see Masahiro Sunohara, et al., "Development of Interconnect Technologies for Embedded Organic Packages", 2003 Electronic Components and Technology Conference, New Orleans, May 27-30 (2003) pp. 1484-1489). A chip is placed face down onto a build-up layer like in an SMT (Surface Mount Technology) process and is fully embedded with subsequent build-up layers.

Another chip-middle active approach involves a laminated structure with active ICs. In this approach, multiple layers with active chips or passive components are fabricated separately and then laminated together. Matsushita is making the multiple layers by pressing conventional discrete passive components into a composite substrate made of ceramic powder and thermosetting resin with inner vias filled by conductive via paste, which is a mix of conductive filler, resin and a hardening agent (see Yoshiko Hara, "Matsushita embeds SoCs, components in substrate", EE TIMES, September (2002)). Nokia uses a PWB (Printed Wiring Board) to make the laminated structures (see U.S. Pat. No. 6,974,724). Chips are placed inside the cavity of the PWB, similar to the chip-first embedded active approaches using organic core cavities. Their issue is that the electrically conductive layers on a PWB can provide electromagnetic shielding to RF chips embedded inside. Nokia has also secured a patent for this. SMIT is also trying to make a laminated structure of embedded active using LCP (liquid crystal polymer) core (see http://www.smitcenter.chalmers.se and http://smit.shu.edu.cn).

While current chip-first and chip-middle embedded active approaches can give many advantages such as small form factor and better electrical performance, they have also many other concerns. (1) serial chip-to-build-up processes accumulate yield losses associated with each process, leading to lower yield and higher cost. (2) defective chips cannot be easily reworked in current embedded package structure. This needs 100% known good die. (3) the interconnections in chip-first approach which are generally bumpless and very short metallurgical contacts can fatigue due to thermal stress. In addition, the electrical performance of chip-middle approach is compromised by long interconnections, like the flip-chip bumps. (4) Thermal management issues are also evident since the chip is totally embedded within less thermally conductive polymer materials of substrate or build-up layers.

However, the chip-last approach has not been explored to the extent of the chip-first and chip-middle approach. As an alternative to chip-first and chip-middle having many issues mentioned above, it would be desirable to explore a chip-last process for fabricating embedded active and/or discrete passive devices with improved processibility, electrical performance and thermal management capability.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 2a-2g shows an exemplary process flow for fabricating an exemplary package containing embedded actives or discrete passives such as is shown in FIG. 1;

DETAILED DESCRIPTION

In order to address the above issues with chip-first and chip-middle approaches, disclosed are chip-last embedded active approaches wherein chips are embedded after all build-up layer processes are finished.

Figure 1:
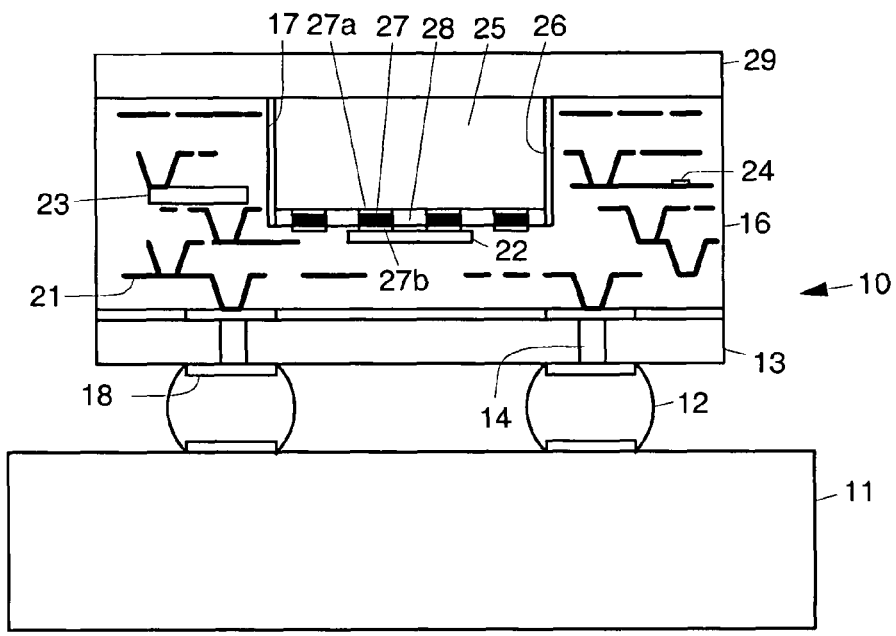
FIG. 1 illustrates a cross-sectional view of an exemplary package comprising embedded actives or discrete passives in a cavity within build-up layers.

Referring now to the drawing figures, FIG. 1 shows a cross-sectional view of an exemplary embedded active package 10, or package structure 10. The exemplary package 10 comprises an embedded actives 25 disposed in a cavity 17 within the build-up layers 16. Instead of active ICs, discrete passives such as IPDs may be also embedded where the active IC is embedded.

Build-up layers 16 comprising a plurality of conductive traces 21 and the cavity 17 are formed on an ultra-thinned core 13 of high elastic modulus and high thermal conductivity 13. During the build-up layer process, a thin film type passive component such as capacitors 22, 23, resistors 24 and inductors, if needed, may also be embedded. The thinned core 13 contains vias 14 that allow it to be connected to a printed circuit board 11 by way of solder bumps 12, for example. A decoupling capacitor 22 is provided at the base of the cavity 17. Thus, an embedded active device 25 can be directly placed in the cavity 17 adjacent to the decoupling capacitor 22 and is connected to the build-up layers 16 using low profile interconnects 27, followed by filling a gap under the embedded active IC 25 with underfill 28 and engineered adhesive materials 26 (encapsulation materials). If needed, a stiffener 29 may be disposed on top of the build-up layers 16 and the back (exposed) side of the chip 25 for better cooling and EMI (electromagnetic interference) shielding.

FIGS. 2a-2g shows an exemplary process flow, or method, for fabricating an exemplary package 10 comprising embedded actives 25 or discrete passives 25 in a cavity 17 within build-up layers 16. The exemplary method for producing embedded actives or discrete passives 25 may be implemented as follows.

The chip 25 may be thinned to a desired thickness using one or more techniques including plasma etching, chemical etching, grinding and polishing. Dicing of a thinned wafer may be achieved using a low-speed dicing process (not shown).

Via holes 14 may be formed in the core 13 by mechanical NC drilling or laser drilling, for example (FIG. 2a). The via holes 14 may be metallized by electroless and electrolytic plating, for example. Pads 18 on the core 13, which are eventually wired and connected to pads 27a on the active 25, may be formed using conventional methods depending on the selected core material.

The core 13 is attached to a rigid plate 20 with adhesive 19 (FIG. 2b). Soluble or thermoplastic adhesives 19 may be employed so that after the build-up layer 16 and chip 25 embedding processes are finished on the core 13, the embedded IC assembly can be easily separated from the rigid plate 20 using solvent or heat. When the core material is very rigid and high modulus, the back side of the core 13 may be thinned in the manner of chip thinning (FIG. 2c) or by modified chip thinning technologies. However, if the core material is organic based and ultra thin, then the thinning process may be omitted.

Build-up layers 16 for routing and blind vias 21 are subsequently formed on the thinned core 13 (FIG. 2d). The build-up layers 16 may be made using standard high density interconnection (HDI) technology. This build-up technology is similar to what is typically used for advanced organic packages and printed circuit boards. For example, metallization of blind vias 21 may be formed using a subtractive process. A conductive metal is sputtered or plated over the entire surface area. A photoresist material is then applied and patterned. Finally, the desired metal pattern is obtained by etching the unprotected photoresist material. Multiple interconnect layers may be formed by applying additional dielectric films and repeating the via and metallization process steps. A thin film type of passive component 22, 23, 24, such as capacitors 22, 23, resistors 24 and inductors, if needed, may also be embedded during the build-up layer process.

After completion of build-up layers 16 on the core 13 as desired, the cavity 17 that is used to embed the chip 25 is formed within the build-up layers 16, such as by using laser drilling, for example (FIG. 2e). The area for the cavity 17 to be formed also has a plurality of pads 27b similar to the metal pad 18. Consequently, the cavity 17 may be easily created without disturbing other metal patterns and embedded thin film passive components. The cavity 17 may be also formed during the build-up layer process. For example, build-up layers 16 with a cavity 17 may be laminated on one or more build-up layers 16 already formed on the thinned core 13. Pads of the build-up layer 16 are also exposed at this time, which are connected to chip pads 27a and interconnects 27.

Figure 2F:
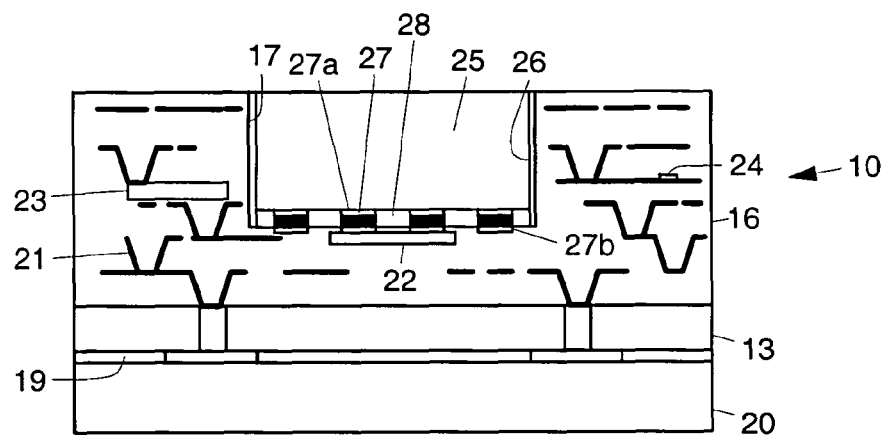

A thinned chip 25 is placed directly into the cavity 17 and connected to the exposed pads 27b in the cavity 17 of the build-up layer 16, followed by filling the cavity 17 with underfill 28 and engineered adhesive materials 26 (FIG. 2f). For interconnection of the embedded IC 25 to the build-up layer 16, various interconnection technologies may be used to enable the shortest interconnects 27 and the most favorable electrical and thermo-mechanical properties, including nano-interconnects and bumpless interconnects, for example. Nano-interconnects are made using thermally stable nano-grained materials with high strength and toughness, and can provide mechanical reliable interconnects even with low profile and fine pitch devices. Bumpless interconnect technology of pad-to-pad bonding can provide the same electrical performance as the chip-first approach. Various underfill materials 28 and processes may be employed to improve chip and package reliability, if necessary. Underfill materials 28 compatible to both the active 25 and build-up layers 16 are used. If needed, a stiffener 29 for cooling and/or EMI shielding may be placed inside and/or outside of the body of the package 10 such as is shown in FIG. 2g.

Figure 2G:
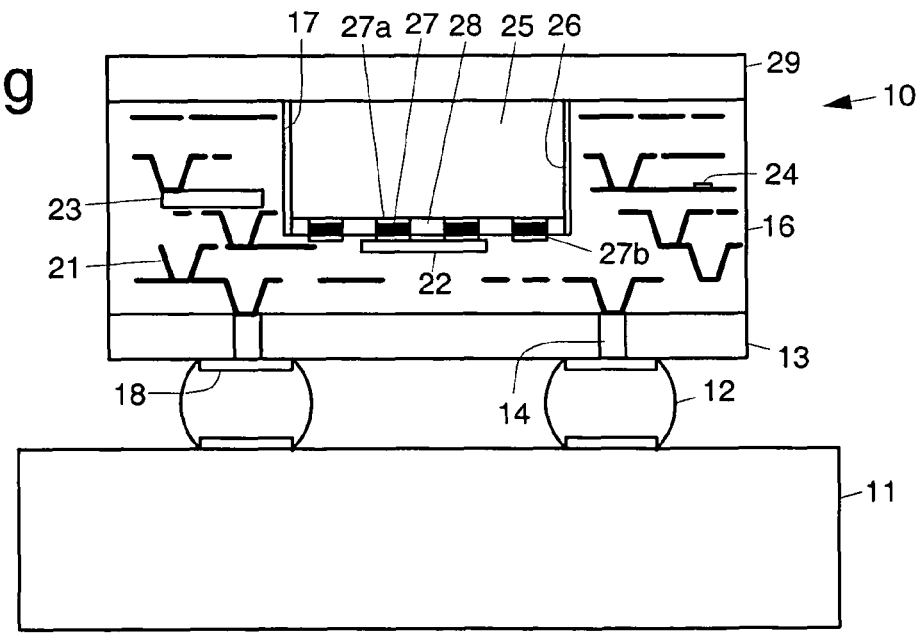

Finally, the entire package 10 with embedded actives 25 is separated from the plate 20, followed by the use of solder balls 12 or other interconnection means to attach and mount the package 10 on a printed circuit board (PCB) 11 (FIG. 2g).

Figure 3:
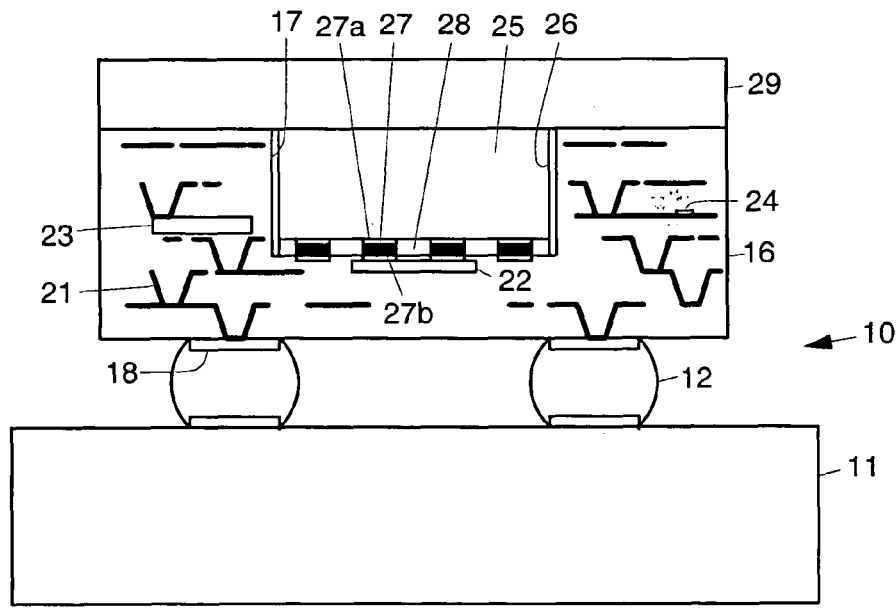
FIG. 3 illustrates a cross-sectional view of an exemplary package comprising embedded actives or discrete passives without a core.

In addition, for a thinner structure containing embedded actives 25, the core 13 may be removed. This structure comprising embedded actives 25 and thin film type of passives 22, 23, 24 without a core 13 is shown in FIG. 3. In this package 10, bottom metal pads 18 wired from the buildup layers 16 are connected by way of the solder bumps 12, for example, to the printed circuit board 11.

Figure 4A:
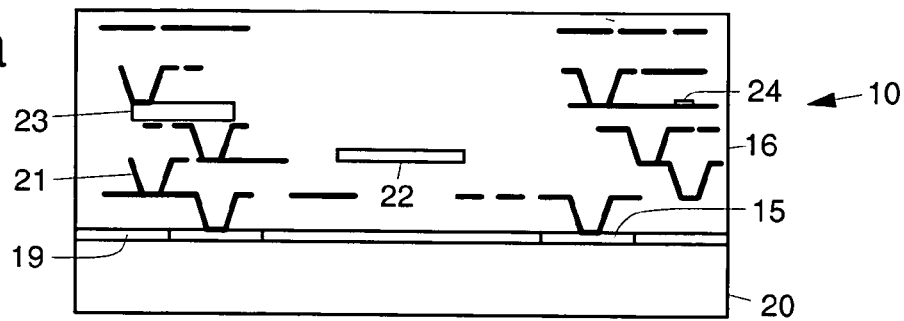
FIGS. 4a-4e shows an exemplary process flow for fabricating an exemplary package containing embedded actives or discrete passives such as is shown in FIG. 3.
Figure 4B:
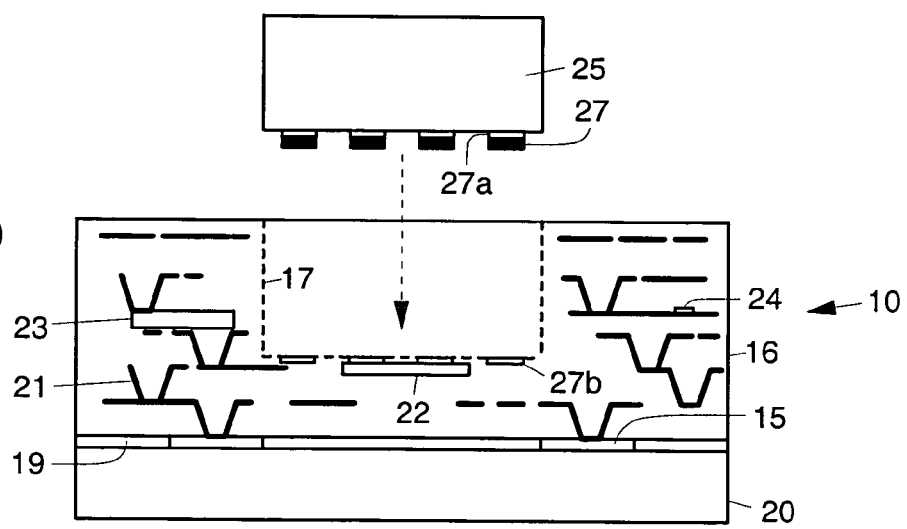
Figure 4C:
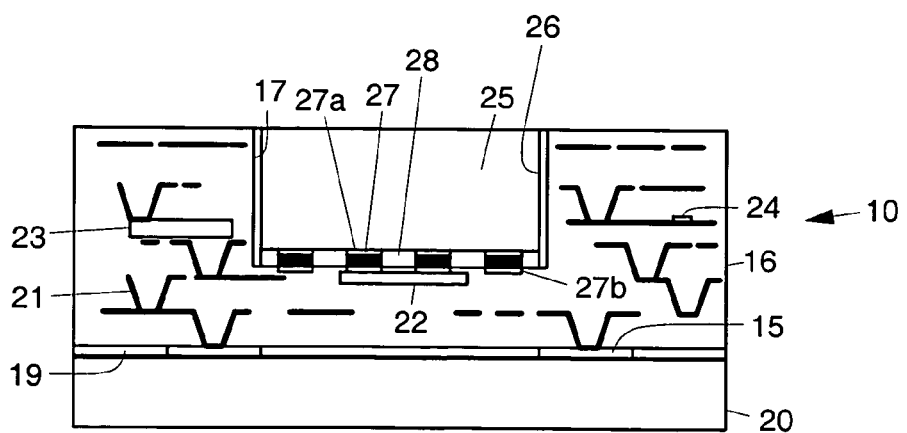
Figure 4D:
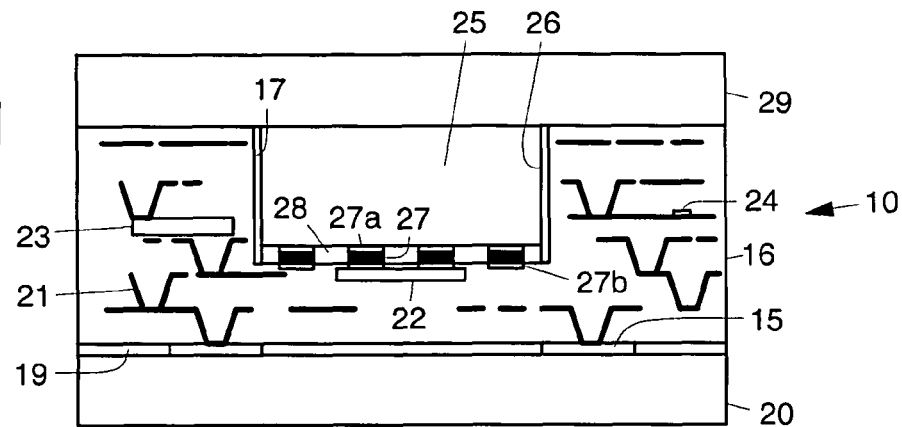
Figure 4E:
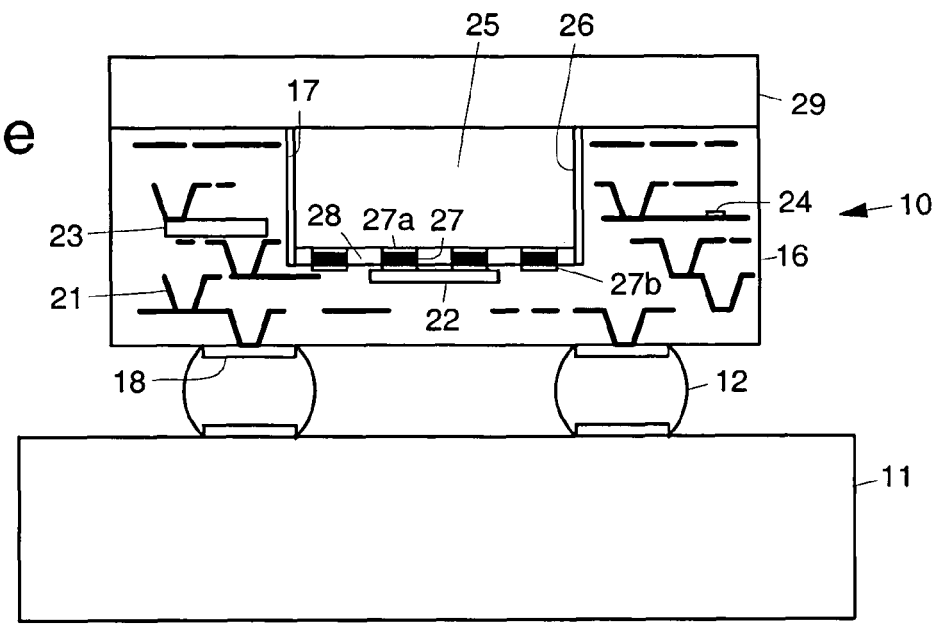

The fabrication process or method for producing the package 10 without a core 13 is very similar to the process disclosed above (FIGS. 4a-4f). However, build-up layers 16 are formed on a rigid plate 20 instead of a thinned core 13 (FIG. 4a). Since the package 10 or module 10 does not have a core 13, the package body is transferred using stiff carrier tape, for example, to the printed circuit board 11 after it is separated from the rigid plate 20 (FIG. 4d) and then mounted on the printed circuit board 11 using solder balls 12, for example, or other interconnection means. After mounting the package body 10, the stiff carrier tape is removed. When such a stiffener 29 for cooling and/or EMI shielding is used as shown in FIG. 4d, the removable stiff carrier tape may not be needed. Another advantage of packages 10 without a core 13 is that the height of solder balls 12 or other interconnects can be minimized, while maintaining board-level reliability. This is possible because the package 10 without a core 13 is thin and flexible enough so that stress arising from thermo-mechanical fluctuation is lower, depending on dielectric materials selected for the build-up layers 16.

The disclosed chip-last approaches for embedded actives 25 has many advantages compared to chip-first or chip-middle technologies from the viewpoints of process, yield, reworkable interconnections and thermal management. These advantages include (1) Lower loss accumulation and higher process yield are expected for mutichip applications, since chip-to-build-up processes are to be parallel In addition, no complex processes are needed after the chip 25 is embedded, which could otherwise damage the chip 25. (2) Defective chips 25 may be easily replaced by using reworkable interconnects 27 and appropriate selection and processing of underfill 28 and encapsulation materials 28 after electrical testing. (3) Short interconnections such as nano-interconnects and bumpless interconnects 27 can give rise to electrical performance as good as direct metallurgical contacts of chip-first embedding active technology. Nano-structured materials of nano-interconnects with high electrical conductivity, excellent mechanical strength, toughness and fatigue resistance can provide mechanically reliable interconnects even with low profile. The electrical performance of the disclosed chip-last technology can reach the level of chip-first approaches by applying advanced bumpless interconnect technologies between the chip 25 and build-up layers 16. (4) Since the backside of embedded chip 25 is directly exposed to air or if needed, bonded to a metallic stiffener 29 comprising a heatsink with high thermal conductivity, thermal management becomes easier and many possible solutions for cooling can be applied.

Thus, packages containing embedded active and passive devices and methods for fabricating such packages have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A method comprising:
fabricating an embedded active package including a top surface and a bottom surface comprising a plurality of build-up layers defining circuit interconnections and that comprise one or more thin film embedded passive devices;
after fabricating the plurality of build-up layers, forming at least one cavity in the build-up layers; and
after forming the at least one cavity, disposing at least one active device in the cavity that is electrically connected to the circuit interconnections of the build-up layers, wherein the electrical connections of the cavity to the circuit interconnections of the build-up layers include a plurality of nano-interconnects or a plurality of bumpless interconnects, and
wherein at least one electrical connection is provided to one or more of the plurality of build-up layers on the top surface of the embedded active package and at least one electrical connection is provided to one or more of the plurality of build-up layers on the bottom surface of the embedded active package.

2. The method recited in claim 1 further comprising forming the build-up layers on a core.

3. The method recited in claim 2 further comprising mounting a bottom surface of the core to a printed circuit board, module substrate or another apparatus.

4. The method recited in claim 2 wherein the core is selected from a group including ceramics, metals, organics and combinations thereof.

5. The method recited in claim 1 further comprising mounting a bottom surface of the build-up layers without core directly to a printed circuit board, module substrate or another apparatus.

6. The method recited in claim 1 further comprising attaching a stiffener to an exposed surface of the at least one active device and an exposed surface of the build-up layers.

7. The method recited in claim 6 wherein the stiffener comprises a high thermal conductivity and electrically conductive metal layer that provides for thermal management and EMI shielding.

8. The method recited in claim 1 further comprising securing the active device in the cavity using underfill and engineered adhesive material.

9. The method recited in claim 1 further comprising connecting the active device to the build-up layers using low profile interconnects, solder bumps, metal columns or bumpless interconnections.

* * * * *